(12) United States Patent
Chen et al.

(10) Patent No.: US 7,794,921 B2
(45) Date of Patent: Sep. 14, 2010

(54) IMAGING POST STRUCTURES USING X AND Y DIPOLE OPTICS AND A SINGLE MASK

(75) Inventors: Yung-Tin Chen, Santa Clara, CA (US);
Steven J. Radigan, Fremont, CA (US);
Paul Poon, Fremont, CA (US); Michael W. Konevecki, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 753 days.

(21) Appl. No.: 11/618,776

(22) Filed: Dec. 30, 2006

(65) Prior Publication Data

US 2008/0160423 A1 Jul. 3, 2008

(51) Int. Cl.
*G03F 7/20* (2006.01)
(52) U.S. Cl. ........................ 430/312; 430/394
(58) Field of Classification Search .............. 430/311, 430/312, 330, 394, 396
See application file for complete search history.

(56) References Cited

U.S. PATENT DOCUMENTS

| 6,063,531 | A | 5/2000 | Singh |
| 6,461,774 | B1 | 10/2002 | Zimlich |
| 6,553,562 | B2 | 4/2003 | Capodieci |
| 6,839,126 | B2 | 1/2005 | Yen |
| 6,875,545 | B2 | 4/2005 | Eurlings |
| 6,934,007 | B2 | 8/2005 | Fritze |
| 7,011,936 | B2 | 3/2006 | Nolscher et al. |
| 2002/0140920 | A1 | 10/2002 | Rosenbluth |
| 2004/0100764 | A1 | 5/2004 | Hanson et al. |
| 2005/0123837 | A1 | 6/2005 | Chen |
| 2005/0153540 | A1 | 7/2005 | Mimotogi |
| 2005/0221200 | A1 | 10/2005 | Chen |
| 2006/0222962 | A1 | 10/2006 | Chen |
| 2007/0003878 | A1* | 1/2007 | Paxton et al. ............ 430/311 |

OTHER PUBLICATIONS

"All refractive hyper NA optics for production immersion lithography," www.fabtech.org, Sep. 27, 2005.
W. H. Arnold, "Extending 193 nm Optical Lithography," Semiconductor International, www.reed-electronics.com, Sep. 1, 2006, 7 pgs.
"Technology backgrounder: Immersion Lithography," IC Knowledge.com, 2003, 5 pgs.
R.B. Darling, slides titled "EE-527: MicroFabrication—Photolithography", printed from http://www.ee.washington.edu/research/microtech/cam/PROCESSES/photolithographypdf.html on Dec. 22, 2006, 31 pages.
International Preliminary Report on Patentability dated Jun. 30, 2009 in PCT Application No. PCT/US2007/088901.
Written Opinion of the International Searching Authority dated Jun. 30, 2009 in PCT Application No. PCT/US2007/088901.
Nakamura, "Low K1 Contact Hole Formation by Double Line and space Formation Method with Contact Hole Mask and Dipole Illumination," Japanese Journal of Applied Physics, Japan Society of Applied Physics, Tokyo, JP, Jun. 1, 2006.
Nakamura, "Contact Hole Formation by Multiple Exposure Technique in Ultralow K1 Lithography," Journal of Microlithography, Microfabrication, and Microsystems, May 13, 2005.
Nakao, "0.10MuM Dense Hole Pattern Formation by Double Exposure Utilizing Alternating Phase Shift Mask Using KRF Excimer Laser as Exposure Light," Japanese Journal of Applied Physics, Japan Society of Applied Physics, Tokyo, JP May 1, 1999.
Search Report and Written Opinion in PCT/US2007/088901, dated Jul. 23, 2008.

* cited by examiner

*Primary Examiner*—Kathleen Duda
(74) *Attorney, Agent, or Firm*—Vierra Magen Marcus & DeNiro LLP

(57) ABSTRACT

A photolithographic method uses different exposure patterns. In one aspect, a photo-sensitive layer on a substrate is subject to a first exposure using optics having a first exposure pattern, such as an x-dipole pattern, followed by exposure using optics having a second exposure pattern, such as a y-dipole pattern, via the same mask, and with the photo-sensitive layer fixed relative to the mask. A 2-D post pattern with a pitch of approximately 70-150 nm may be formed in a layer beneath the photo-sensitive layer using 157-193 nm UV light, and hyper-numerical aperture optics, in one approach. In another aspect, hard baking is performed after both of the first and second exposures to erase a memory effect of photoresist after the first exposure. In another aspect, etching of a hard mask beneath the photo-sensitive layer is performed after both of the first and second exposures.

32 Claims, 9 Drawing Sheets

Poly, 2010
Photoresist squares, 1920

Fig. 21

Poly, 2010
Hard mask squares, 2120

Fig. 22

Hard mask, 1220
Poly, 1230
Substrate, 1240

Fig. 23

IMAGING POST STRUCTURES USING X AND Y DIPOLE OPTICS AND A SINGLE MASK

BACKGROUND OF THE INVENTION

1. Field of the Invention

The present invention relates to photolithographic techniques for use in fabricating integrated circuits.

2. Description of the Related Art

Photolithography is a photographic process used to transfer circuit patterns onto a semiconductor wafer. The process generally involves projecting light through a patterned mask onto a silicon wafer which is covered with a photosensitive film, e.g., photoresist. A stepper move across the mask, projecting light through the mask to image portions of the photoresist corresponding to the mask pattern. The wafer is then developed so that the exposed or unexposed portions of the photoresist are removed, depending on the type of resist used. While photolithography is a relatively mature technology, new challenges are encountered by the ever present desire to scale down feature sizes.

SUMMARY OF THE INVENTION

The present invention addresses the above and other issues by providing a photolithographic method for fabricating a pattern on a substrate using different exposure patterns.

In one embodiment, a photolithographic method for fabricating a pattern on a photosensitive layer on a substrate includes comprises first exposing of the photosensitive layer using a mask and hyper-numerical aperture optics providing a first exposure pattern, and second exposing of the photosensitive layer using the mask and hyper-numerical aperture optics providing a second exposure pattern, different than the first exposure pattern. Thus, the same mask is used for both exposures. Further, the photosensitive layer remains in a fixed position relative to the mask during the first and second exposing.

A hyper-numerical aperture is an aperture greater than one, and may be achieved using water immersion optics, for instance. In one approach, the first and second exposure patterns comprise respective orthogonal dipole exposure patterns, e.g., an x-dipole pattern and a y-dipole pattern.

Further, the first exposing results in a light intensity pattern on the photosensitive layer in which lines of intensity minima are substantially equally spaced in a first direction, and the second exposing results in a light intensity pattern on the photosensitive layer in which lines of intensity minima are substantially equally spaced in a second direction, orthogonal to the first direction. For example, the lines of intensity minima in the first direction can be substantially equally spaced at a pitch of approximately 70-150 nm, and the lines of intensity minima in the second direction can be substantially equally spaced in the second direction also at a pitch of approximately 70-150 nm. Spacing of the lines of intensity minima in the first direction can be substantially equal to, or can differ from, spacing of the lines of intensity minima in the second direction.

The method may further include developing the photosensitive layer to form a mask from the photosensitive layer, and etching a layer which is beneath the photosensitive layer using the mask formed from the photosensitive layer, thereby forming a two-dimensional array of features, such as posts, in the layer which is beneath the photosensitive layer.

The developing can be performed after the first and second exposing without performing additional exposing of the photosensitive layer after the first and second exposing. For example, no additional exposure using a trim mask need be performed.

In another embodiment, a photolithographic method for fabricating a pattern on a photosensitive layer on a substrate includes first exposing of the photosensitive layer using a mask and optics providing a first exposure pattern, resulting in a light intensity pattern on the photosensitive layer in which lines of intensity minima are substantially equally spaced in a first direction at a pitch of approximately 70-150 nm, and second exposing of the photosensitive layer using the mask and optics providing a second exposure pattern, different than the first exposure pattern, resulting in a light intensity pattern on the photosensitive layer in which lines of intensity minima are substantially equally spaced in a second direction, orthogonal to the first direction, at a pitch of approximately 70-150 nm. For instance, the second exposure pattern can be orthogonal to the first exposure pattern.

In another embodiment, a photolithographic method for fabricating a pattern on a photosensitive layer on a substrate includes first masked exposing of the photosensitive layer using optics providing a first exposure pattern, first hard baking of the photosensitive layer after the first exposing, and, after the first hard baking, second masked exposing of the photosensitive layer using optics providing a second exposure pattern, different than the first exposure pattern. The method may further include second hard baking of the photosensitive layer after the second exposing, and developing the photosensitive layer after the second hard baking.

In another embodiment, a photolithographic method for fabricating a pattern on a photosensitive layer on a substrate includes transferring a first mask pattern to a photosensitive layer, where the first mask pattern includes spaced apart rows which extend in a first direction. The method may further include performing a first etching operation on a hard mask layer beneath the photosensitive layer, after transferring the first mask pattern, and transferring a second mask pattern to the photosensitive layer, where the second mask pattern includes spaced apart rows which extend in a second direction. The method may further include performing a second etching operation on the hard mask layer, after transferring the second mask pattern and etching a layer which is beneath remaining portions of the hard mask layer. Further, a stripping operation may be performed on the photosensitive layer, after performing the second etching operation, thereby revealing the remaining portions of the hard mask layer.

The first and second mask patterns can be transferred to the photosensitive layer via a common mask, by rotating the mask ninety degrees, or by rotating the photosensitive layer ninety degrees, for instance.

DETAILED DESCRIPTION

The present invention provides a photolithographic method for fabricating a pattern on a substrate using different exposure patterns.

Figure 1:
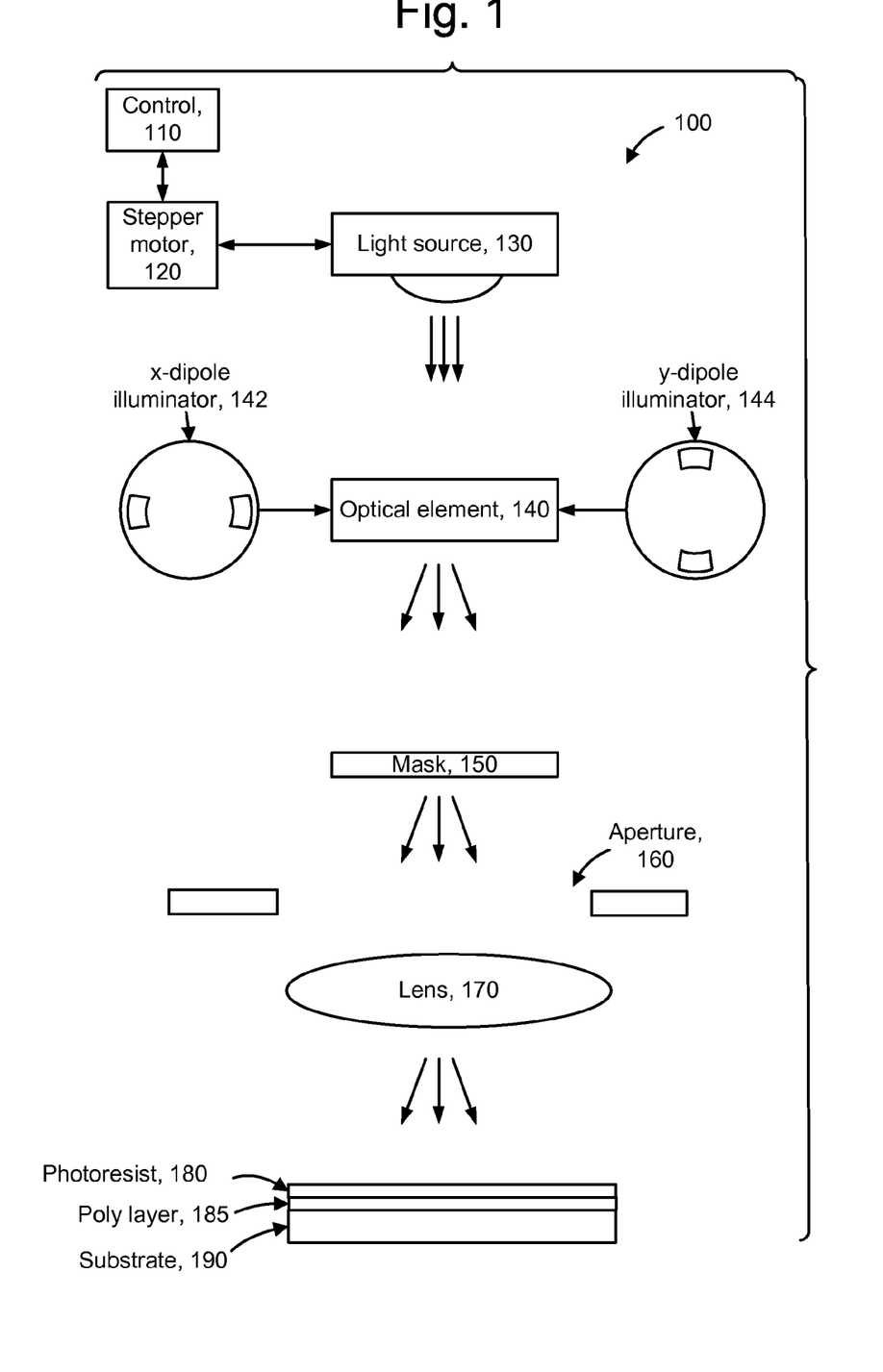
FIG. 1 depicts a photolithographic apparatus.

FIG. 1 depicts a photolithographic apparatus. The apparatus, shown generally at 100, includes a control 110, stepper motor 120, light source 130, optical element 140, mask 150, aperture 160 and projection lens 170. A pattern of the mask 150 is transferred to a photoresist film 180 on a substrate 190 such as a wafer. A polysilicon (poly) layer 185 is provided on the substrate in an example implementation. Other materials can be used instead of poly in a layer beneath the photoresist film 180, such as tungsten or other metal substrate. The photoresist film has a pre-determined thickness which is suitable for its intended application. In this simplified example, under control of the stepper motor 120, the light source 130 and optical element 140 move relative to the mask 150, while the photoresist film 180 is held in a fixed position in relation to the mask 150. In particular, the light source 130 and optical element 140 expose portions of the photoresist film 180 as they move across the pattern of the mask 150. Further, the optical element 140 can be configured to use at least first and second optical elements having different exposure patterns. For example, a first exposure of the photoresist film 180 can be performed with the first optical element in place, after which a second exposure of the photoresist film 180 can be performed with the second optical element in place.

In one possible approach, the first and second optics can have exposure patterns which are orthogonal to one another. This can be achieved, e.g., using an x-dipole illuminator 142 and a y-dipole illuminator 144 which are used at different times for the first and second exposures. In one possible approach, the optical element 140 is held in a rotating or otherwise movable holder which holds the x-dipole illuminator 142 and a y-dipole illuminator 144, and can be moved to select either the x-dipole illuminator 142 or the y-dipole illuminator 144 for exposing the photoresist film 180. The lens 170 provides reduction optics which reduces the incident light beam to cause an exposure pattern on the photoresist film corresponding to a pattern on the mask 150. The mask 150 can be a chrome-less mask, chrome-on-glass mask or attenuating phase shifting mask, for example. The mask can be provided with a mask bias and phase angle which is optimum for its intended application.

Further, the photolithographic apparatus 100 may use immersion lithography. In one approach, water is dispensed between the lens 170 and the photoresist film 180, and surface tension results in a puddle on the photoresist film 180. Since the index of refraction (n) of water is n>1 (e.g., 1.47 for ultrapure water), a numerical aperture (NA) of >1 can be achieved. The lens 170 in combination with the water puddle provide hyper-numerical aperture (NA>1) optics which can resolve a smaller feature width than the lens 170 in air. For example, with the light source 130 providing UV light at $\lambda$=193 nm, and NA=1.2, a feature size of about 45 nm can be achieved. Specifically, with the relation: feature size=$k1 \times \lambda$/NA, we have 45 nm=0.28×193 nm/1.2. An NA of approximately 1.0-1.5 may be used, for instance.

In one possible implementation, the lithographic apparatus 100 can be used to image 45 nm post structures, also referred to as pillars, in the poly layer 185 beneath the photoresist 180, using the pattern formed in the photoresist as a mask. Such structures are useful in providing different types of integrated circuits including those used for providing non-volatile memory. However, imaging post structures to meet desired feature size criteria can be extremely challenging. Further, improved resolution can be achieved by imaging the photoresist film 180 in multiple exposures, including a first exposure which uses first optics providing a first exposure pattern followed by a second exposure which uses second optics providing a second exposure pattern. In one approach, the exposure patterns are orthogonal to one another. In a specific implementation, the first optics includes the x-dipole illuminator 142 and the second optics includes the y-dipole illuminator 144, as discussed further below.

Figure 2:
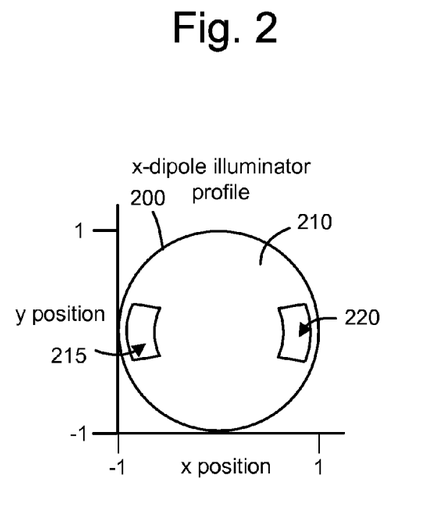
FIG. 2 depicts a profile of an x-dipole illuminator.

FIG. 2 depicts a profile of an x-dipole illuminator. The profile is depicted by reference to an x-y axis, where x and y positions extends between respective normalized indices of −1 and 1. The x-dipole illuminator 200 includes an opaque region 210 and two opposing apertures 215 and 220 through which light passes for exposing the photoresist film 180.

Figure 3:
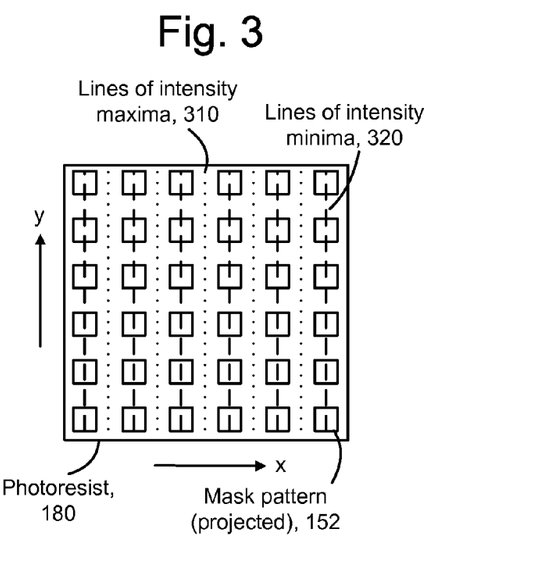
FIG. 3 depicts lines of intensity maxima and minima on a photoresist after exposure using the x-dipole illuminator of FIG. 2.

FIG. 3 depicts lines of intensity maxima and minima on a photoresist after exposure using the x-dipole illuminator of FIG. 2. The mask pattern 152 as projected on the photoresist 180 is depicted, in addition to lines of intensity maxima 310 and lines of intensity minima 320 which extend across a plane of the photoresist film 180 in a vertical line image. The lines of intensity maxima 310 represent regions on the photoresist film 180 which are exposed to a maximum light intensity from the light source 130, while the lines of intensity minima 320 represent regions on the photoresist film 180 which are exposed to a minimum light intensity from the light source 130. Essentially, the intensity pattern include areas of substantially equal intensity in the y direction, for a given x position, while for a given y position, the intensity modulates periodically from a minimum to a maximum in the x direction.

Further, the lines of intensity maxima 310 can be substantially equally spaced apart from one another in the x direction, while the lines of intensity minima 320 can also be substantially equally spaced apart from one another in the x direction. Furthermore, the lines of intensity maxima 310 and the lines of intensity minima 320 can also be substantially equally spaced apart from one another in the x direction.

Figure 4:
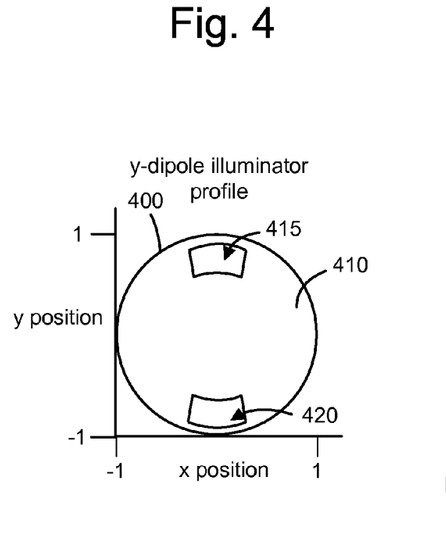
FIG. 4 depicts a profile of a y-dipole illuminator.

FIG. 4 depicts a profile of a y-dipole illuminator. The profile is depicted by reference to an x-y axis, where x and y positions extends between respective normalized indices of −1 and 1. The y-dipole illuminator 400 includes an opaque region 410 and two opposing apertures 415 and 420 through which light passes for exposing the photoresist film 180.

The y-dipole illuminator can be the same as the x-dipole illuminator 200 rotated by 90 degrees in one possible approach. In particular, this approach results in an exposure pattern which is similar in the x and y direction. As a result, the structures formed in the photoresist film after developing will have a symmetric shape in the x and y directions. In another approach, the y-dipole illuminator, when rotated by 90 degrees, differs from the x-dipole illuminator 200. For example, the size of the illuminator, and/or the size and/or position of the apertures 415 and 420 can differ. To illustrate, reducing the length of the apertures 415 and 420 in the y direction will result in higher light intensity profile.

Figure 5:
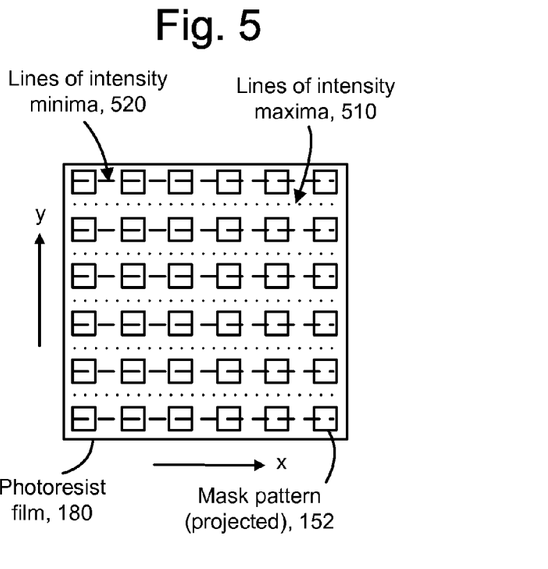
FIG. 5 depicts lines of intensity maxima and minima on a photoresist after exposure using the y-dipole illuminator of FIG. 4.

FIG. 5 depicts lines of intensity maxima and minima on a photoresist after exposure using the y-dipole illuminator of FIG. 4. The mask pattern 152 as projected on the photoresist 180 is depicted, in addition to lines of intensity maxima 510 and lines of intensity minima 520 which extend across a plane of the photoresist film 180 in a horizontal line image. The lines of intensity maxima 510 represent regions on the photoresist film 180 which are exposed to a maximum light intensity from the light source 130, while the lines of intensity minima 520 represent regions on the photoresist film 180 which are exposed to a minimum light intensity from the light source 130. Essentially, the intensity pattern include areas of substantially equal intensity in the x direction, for a given y position, while for a given x position, the intensity modulates periodically from a minimum to a maximum in the y direction.

Further, the lines of intensity maxima 510 can be substantially equally spaced apart from one another in the y direction, while the lines of intensity minima 520 can also be substantially equally spaced apart from one another in the y direction. Furthermore, the lines of intensity maxima 510 and the lines of intensity minima 520 can also be substantially equally spaced apart from one another in the y direction.

Additionally, referring to FIGS. 3 and 5, depending on the illuminators which are used, the spacing of the lines of intensity maxima 310 and 510 can be substantially equally to one another, and/or the lines of intensity minima 320 and 520 can be substantially equally to one another. Also, as mentioned, if the illuminators 200 and 400 differ beyond the 90 degree rotation, the spacing of the lines of intensity maxima 310 in the x direction can be substantially different than the spacing of the lines of intensity maxima 510 in the y direction. Further, the spacing of the lines of intensity minima 320 in the x direction can be substantially different than the spacing of the lines of intensity minima 520 in the y direction. Structures whose cross-section in a plane of the photoresist is generally square shaped or rectangular shaped (with adjacent sides of different lengths) can be formed depending on the spacing of the lines of minima or maxima in the x and y directions.

Figure 6:
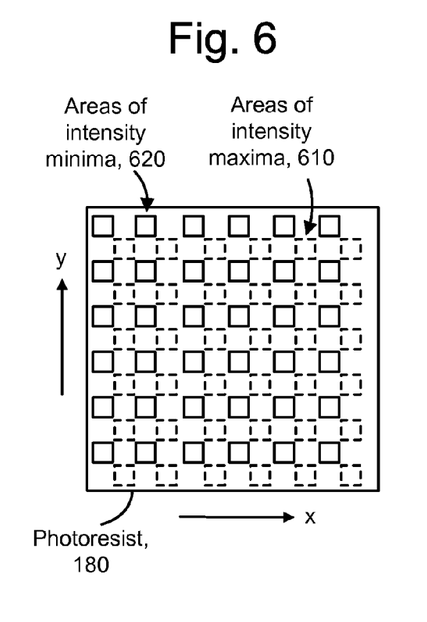
FIG. 6 depicts areas of intensity maxima and minima on a photoresist after exposure using the x-dipole illuminator of FIG. 2 and the y-dipole illuminator of FIG. 4.
Figure 7:
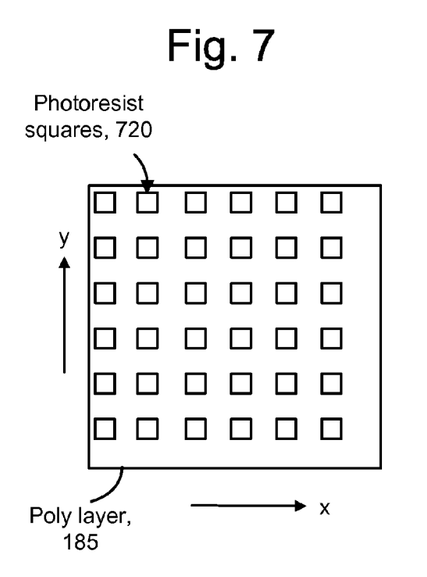
FIG. 7 depicts a top view of the poly layer which is revealed after developing the photoresist of FIG. 6.

FIG. 6 depicts areas of intensity maxima and minima on a photoresist after exposure using the x-dipole illuminator of FIG. 2 and the y-dipole illuminator of FIG. 4. Exposure using the two illuminators results in an intensity pattern on the photoresist film 180 which is represented by a 2-D grid in which the lines of intensity maxima 310 in the x direction intersect with the lines of intensity maxima 510 in the y direction, at areas of intensity maxima 610, depicted as generally square areas. Further, the lines of intensity minima 320 in the x direction intersect with the lines of intensity minima 520 in the y direction, at areas of intensity minima 620, depicted as generally square areas. In practice, the square shape is rounded off at the edges. After the photoresist film 180 is developed to form a mask, the poly beneath the photoresist mask is etched so that features such as post structures or voids 720 (FIG. 7) are formed in the poly beneath the areas of intensity minima 620, depending on whether the photoresist film 180 is a positive or negative photoresist, respectively. FIG. 7 depicts a top view of the poly layer which is revealed after developing the photoresist of FIG. 6, and the remaining photoresist portions which are square in this example.

Figure 8:
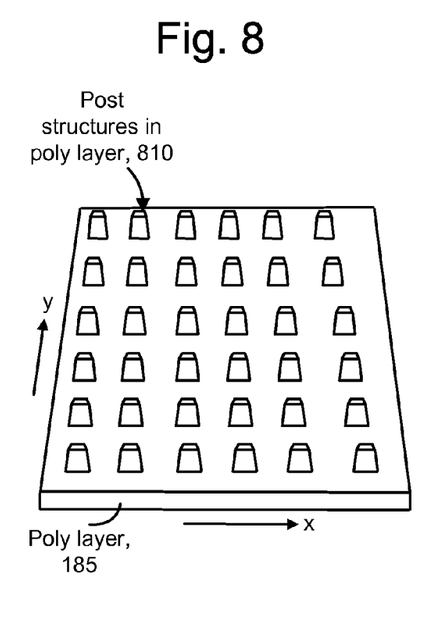
FIG. 8 depicts a tilted view of post structures formed after etching the poly later beneath a positive photoresist such as shown in FIG. 7.

FIG. 8 depicts a tilted view of post structures formed after etching the poly later beneath a positive photoresist such as shown in FIG. 7. If the photoresist film 180 is a positive photoresist, indicating that areas exposed to maximum intensity are removed and areas exposed to minimum intensity remain, features such as post structures 810 can be formed in the poly layer 185 or other material which is beneath the photoresist film by etching the poly layer using the pattern provided by the remaining photoresist. The features can be spaced apart by a pitch of approximately 70-150 nm, for instance. In an example embodiment, the pitch is approximately 90 nm.

Figure 9:
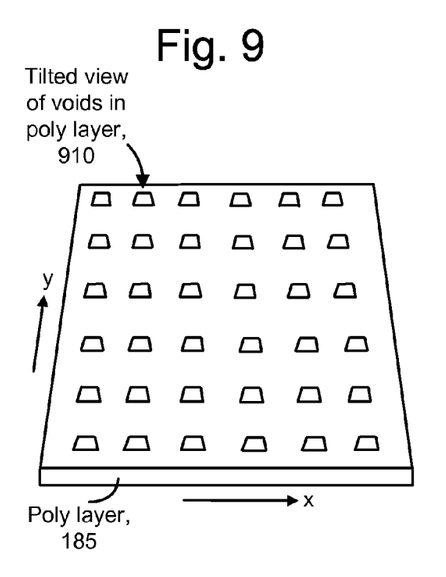
FIG. 9 depicts a tilted view of voids formed after etching a poly later beneath a negative photoresist such as shown in FIG. 7.

FIG. 9 depicts a tilted view of voids formed after etching a poly later beneath a negative photoresist such as shown in FIG. 7. If the photoresist film 180 is a negative photoresist, indicating that areas exposed to maximum intensity remain and areas exposed to minimum intensity are removed, voids 900 are formed. For instance, voids such as holes for dense array contact hole printing can be provided.

Figure 10:
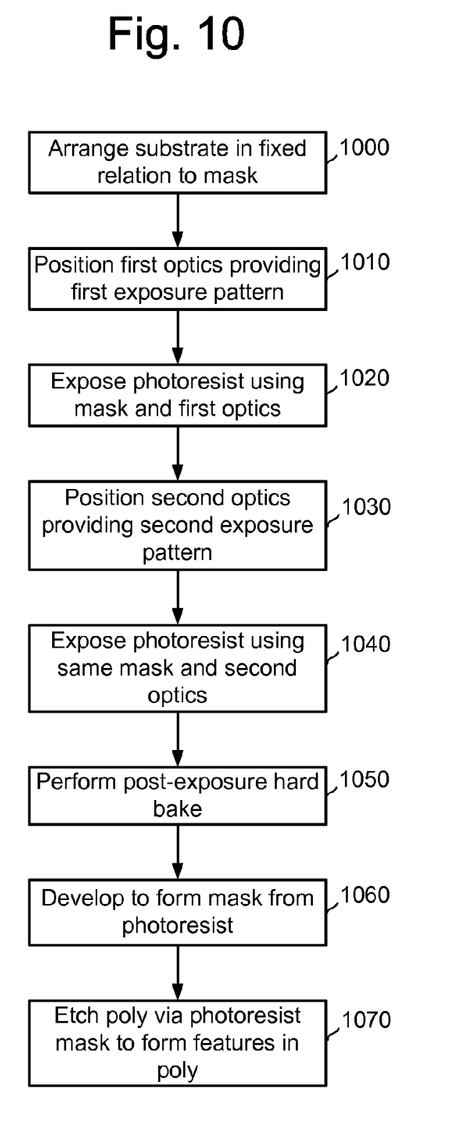
FIG. 10 depicts a photolithographic process which includes first and second exposures of a photo-sensitive layer via a common mask using first and second optics having different exposure patterns.

FIG. 10 depicts a photolithographic process which includes first and second exposures of a photo-sensitive layer via a common mask using first and second optics having different exposure patterns. Note that in this and the other flowcharts, not all necessary steps are shown. Photolithography generally involves a number of steps, including surface preparation, which can include wafer cleaning and priming, coating the wafer with the photoresist such as by spin coating, and a pre-exposure bake (soft bake) which is used to evaporate the coating solvent and to densify the resist after spin coating. Other steps include alignment of the mask to the substrate, exposure of the photoresist, post-exposure bake of the photoresist, and development of the photoresist in which the photoresist is washed in a development solution which removes exposed areas of the photoresist (for a positive photoresist) or unexposed areas of the photoresist (for a negative photoresist). A post-exposure bake is used to activate a chemically amplified reaction in the exposed area. A post-development hard bake is used to stabilize and harden the developed photoresist, after which processing using the photoresist as a masking film is performed to transfer the pattern of the mask to the substrate below the photoresist. Other steps include stripping the photoresist from the substrate and post processing cleaning.

A double exposure photolithographic process using a single mask is suitable for imaging features such as post structure of approximately 45 nm, in one implementation. For instance, x and y dipole exposures provide a large process window and can reduce optical interference, e.g., compared to C-quad (quadrupole) illumination. Further, in one possible approach, a chrome-less mask with optimal mask bias and phase angle is used. The process includes arranging the substrate with the photoresist film in fixed relation to a mask (step 1000). At step 1010, first optics having a first exposure pattern, such as the x-dipole illuminator, are positioned in the photolithography apparatus, e.g., as optical element 140 in the apparatus 100 of FIG. 1. At step 1020, the photoresist is exposed using the mask and the first optics in a first lithographic pass. At step 1030, second optics having a second exposure pattern, such as the y-dipole illuminator, are positioned in the photolithography apparatus in place of the first optics. At step 1040, the photoresist is exposed using the same mask and the second optics in a second lithographic pass. At step 1050, a post-exposure hard bake is performed on the wafer and, at step 1060, developing to form a mask from the photoresist is performed. Typically, the wafer is removed from the photolithography apparatus after being exposed, then placed in an oven for the post-exposure hard bake. The wafer is then removed from the oven to another area for developing the photoresist. Specific parameters of the hard bake, such as time and temperature, can be set according to the application and layers used. Additionally, specific parameters of the developing can be set according to the application and layers used. Step 1070 depicts etching of the poly layer via the photoresist mask to form features such as posts or other raised structures or voids in the poly layer. A 2-D array of such features can be formed in a plane of the poly.

Figure 11:
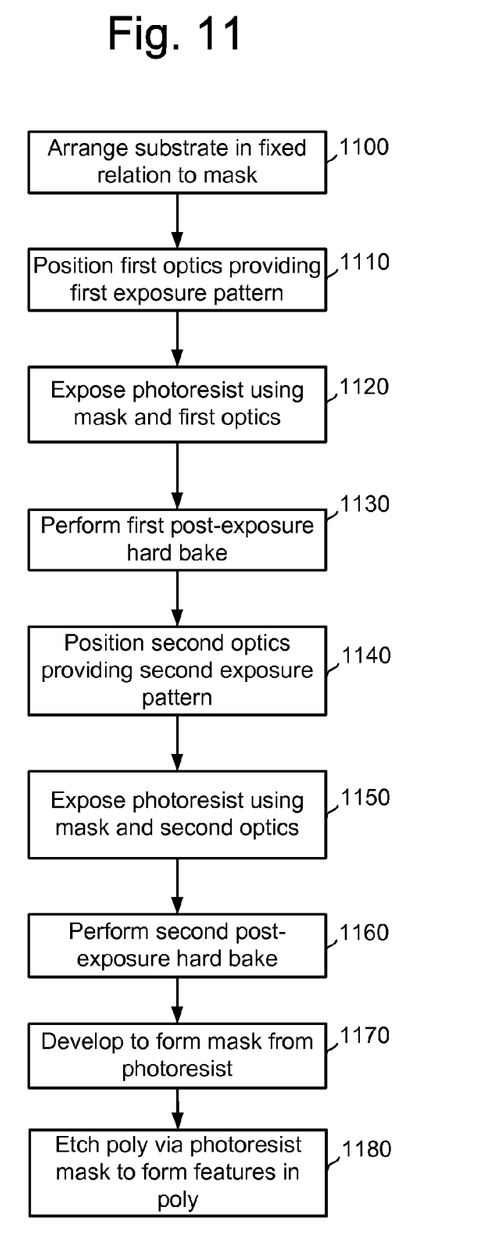
FIG. 11 depicts a photolithographic process which includes first and second hard bakes of a photo-sensitive layer after first and second exposures, respectively, using optics having different exposure patterns.

FIG. 11 depicts a photolithographic process which includes first and second hard bakes of a photo-sensitive layer after first and second exposures, respectively, using optics having different exposure patterns. In one possible approach, a chrome-less mask with optimal mask bias and phase angle is used. The process includes arranging the substrate with the photoresist film in fixed relation to a mask (step 1100). At step 1110, first optics having a first exposure pattern, such as the x-dipole illuminator, are positioned in the photolithography apparatus. At step 1120, the photoresist is exposed using the mask and the first optics in a first lithographic pass. At step 1130, a first post-exposure hard bake is performed. The first post-exposure bake serves to erase a "memory effect" of a photon distribution which occurs in the photoresist due to the first exposure. The photon distribution in the photoresist after the first exposure would otherwise persist and be altered by the second exposure, reducing the sharpness of the light intensity and also reducing the process window. Further, parameters of the first and second post exposure bakes can be set to an optimal level based on the specific implementation. In one example implementation, the time and/or temperature of the first post exposure bake can be approximately 5 to 15% higher than in the second exposure bake.

The wafer can be removed from the photolithography apparatus and placed in an oven for the hard bake, which is also used to stabilize and harden the photoresist. After the hard bake, and subsequent cooling, the wafer is returned to the photolithography apparatus and re-aligned to the mask. The same mask or a different mask can be used. At step 1140, second optics having a second exposure pattern, such as the y-dipole illuminator, are positioned in the photolithography apparatus in place of the first optics. At step 1150, the photoresist is exposed using the mask and the second optics in a second lithographic pass. At step 1060, the wafer is removed from the photolithography apparatus and placed in an oven for a second post-exposure hard bake. In one example implementation, as mentioned, the time and/or temperature of the second post exposure bake can be approximately 5 to 15% lower than the first exposure bake. The wafer is then removed from the oven to another area for developing the photoresist to form a mask from the photoresist, at step 1070. Specific parameters of the hard bakes can be set according to the application and layers used. Additionally, specific parameters of the developing can be set according to the application and layers used. Step 1080 depicts etching of the poly layer via the photoresist mask to form features such as posts or other raised structures or voids in the poly layer. A 2-D array of such features can be formed in a plane of the poly or other material beneath the photoresist.

Figure 12:
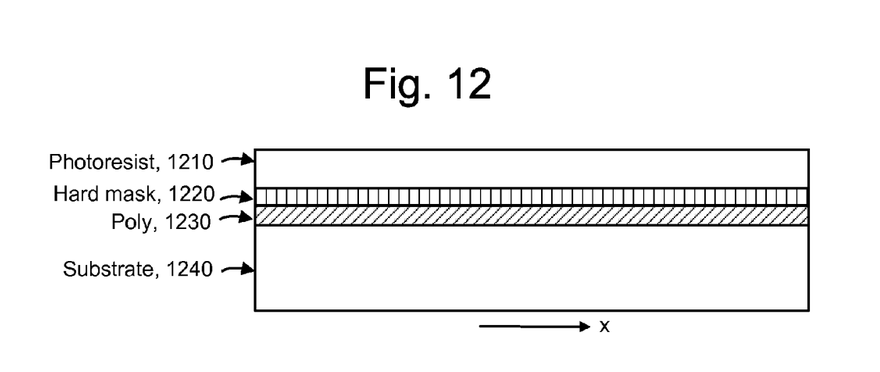
FIG. 12 depicts a cross-sectional view of a substrate including poly, hard mask and photoresist layers.

FIGS. 12-23 describe an additional photolithographic process which uses a hard mask layer on the substrate for patterning desired features in a poly layer or other material below the hard mask layer. In particular, FIG. 12 depicts a cross-sectional view of a substrate 1240 including poly 1230, hard mask 1220 and photoresist layers 1210. An x-direction is depicted. A y-direction extends orthogonal to the x-direction, into the page.

Figure 13:
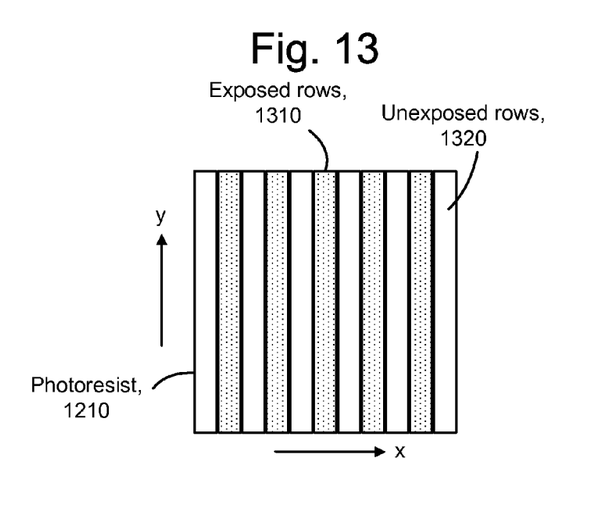
FIG. 13 depicts a top view of the substrate of FIG. 12 with a first exposure pattern.
Figure 14:
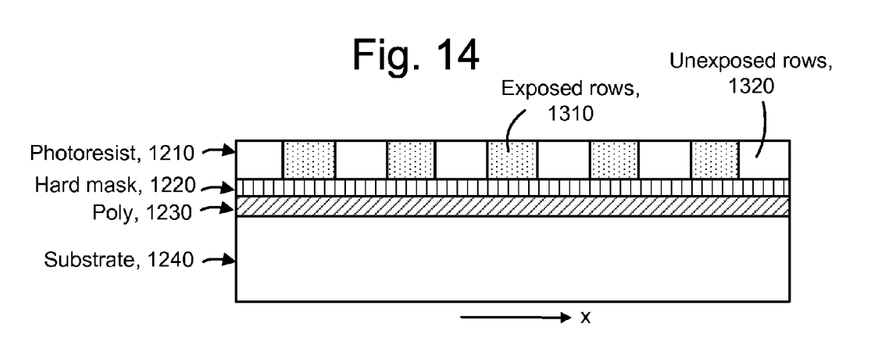
FIG. 14 depicts a cross-sectional view of the substrate of FIG. 13 showing exposed and unexposed rows of the photoresist.

FIG. 13 depicts a top view of the substrate of FIG. 12 with a first exposure pattern. A mask having a pattern represented by spaced apart rows can be used to provide exposed rows, such as example exposed row 1310, and unexposed rows, such as example unexposed row 1320, extending in the y-direction, for example, on the photoresist 1210. FIG. 14 depicts a cross-sectional view of the substrate of FIG. 13 showing the alternating exposed rows, e.g., row 1310 and the unexposed rows, e.g., row 1320, of the photoresist.

Figure 15:
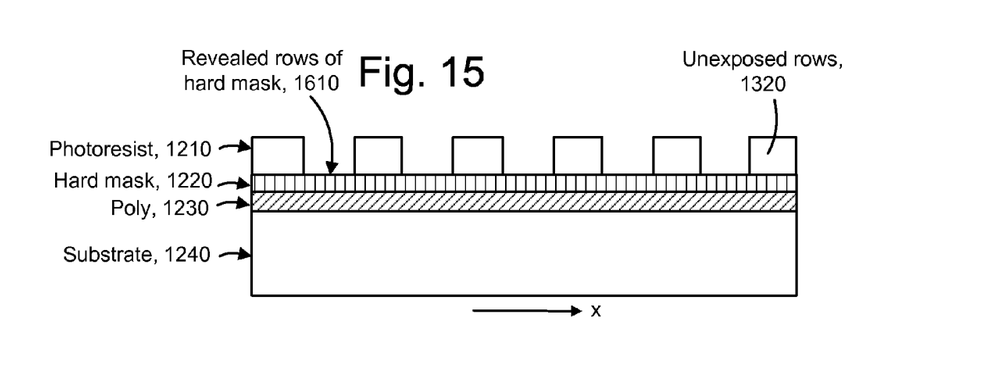
FIG. 15 depicts the substrate of FIG. 14 after developing the photoresist to form a mask.
Figure 16A:
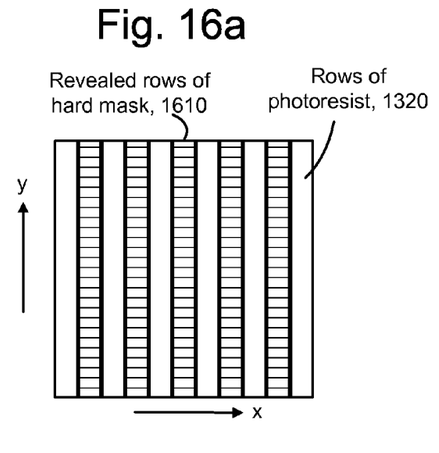
FIG. 16a depicts a top view of FIG. 15.

FIG. 15 depicts the substrate of FIG. 14 after developing the photoresist to form a mask. In this example, the photoresist is a positive photoresist, so the exposed portions of the photoresist are removed, leaving the unexposed rows, e.g., row 1320, of the photoresist and revealing rows of the hard mask 1610 where the photoresist is removed. FIG. 16a depicts a top view of FIG. 15.

Figure 16B:
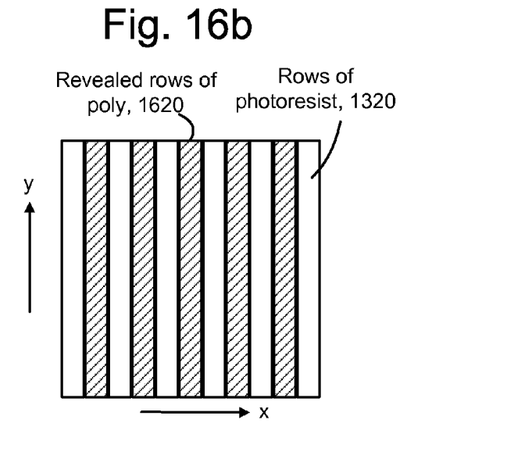
FIG. 16b depicts a top view of the substrate of FIG. 16a after etching the hard mask using the photoresist mask.
Figure 17:
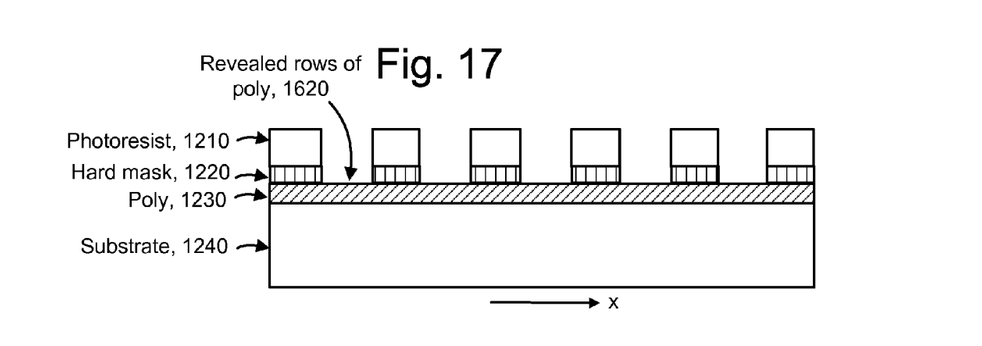
FIG. 17 depicts a cross-sectional view of the substrate of FIG. 16b showing the hard mask etched down to the poly layer.

FIG. 16b depicts a top view of the substrate of FIG. 15 after etching the hard mask using the photoresist mask, thereby revealing rows 1620 of the poly layer or other material beneath the hard mask. Thus, spaced apart rows of the hard mask which are revealed when the photoresist is developed are etched down to the poly to provide the configuration of FIG. 16b. FIG. 17 depicts a cross-sectional view of the substrate of FIG. 16b showing portions of the hard mask 1220 etched down to the poly layer 1230.

Figure 18:
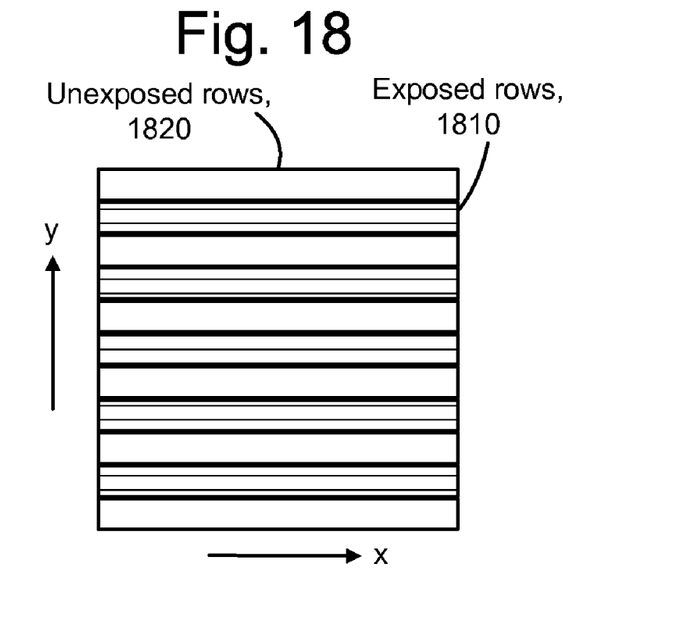
FIG. 18 depicts a top view of the substrate of FIG. 17 with a second exposure pattern.
Figure 19:
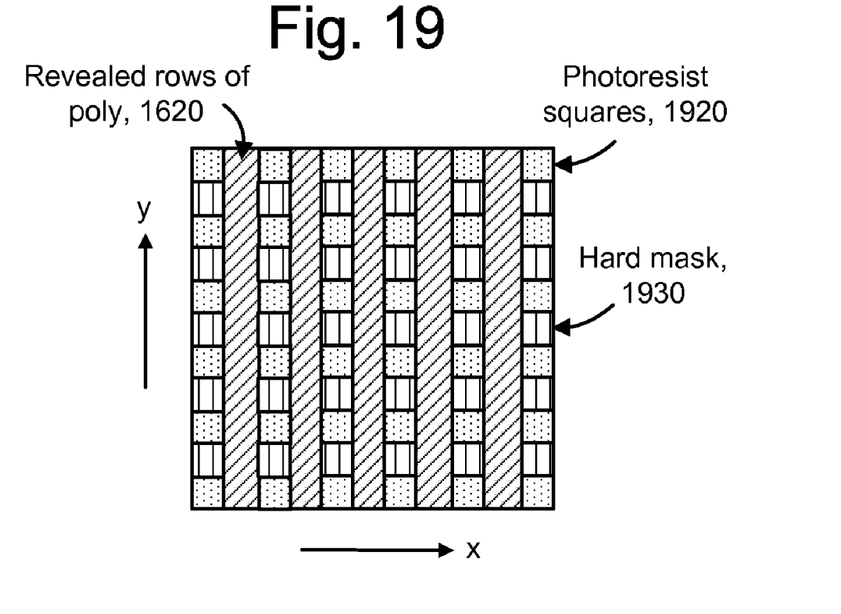
FIG. 19 depicts the substrate of FIG. 18 after developing the photoresist to form a mask.
Figure 20:
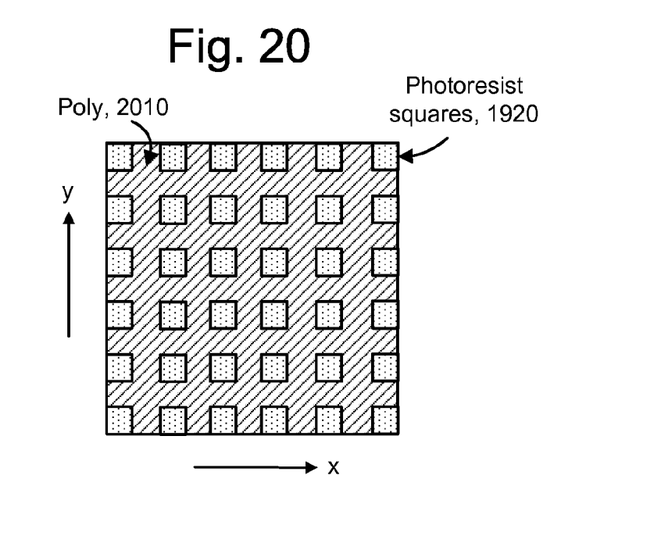
FIG. 20 depicts the substrate of FIG. 19 after etching portions of the hard mask down to the poly layer using the photoresist mask.

FIG. 18 depicts a top view of the substrate of FIG. 17 with a second exposure pattern. A mask having a pattern represented by spaced apart rows can be used to provide exposed rows, such as example exposed row 1810, and unexposed rows, such as example unexposed row 1820, extending in the x-direction, for example, on the photoresist. For example, the same mask may be used as in FIG. 13 but rotated ninety degrees. Or, the substrate may be rotated ninety degrees relative to the mask. Thus, the spaced apart rows of the two patterns may extend in orthogonal directions. FIG. 19 depicts the substrate of FIG. 18 after developing the photoresist to form a further photoresist mask. Portions of the hard mask 1930 are revealed when the photoresist is developed this second time. Here, the remaining portions of the photoresist are squares, such as example square 1920, although other shapes such as rectangles can be provided as well. Specifically, the remaining portions of the photoresist can be rectangular, with adjacent sides of unequal length, if the rows in the x and y direction have different widths, for instance. The revealed rows 1620 of the poly are also indicated. FIG. 20 depicts the substrate of FIG. 19 after etching portions of the hard mask 1930 down to the poly layer or other layer beneath the photoresist using the photoresist mask, revealing the poly layer 2010.

Figure 21:
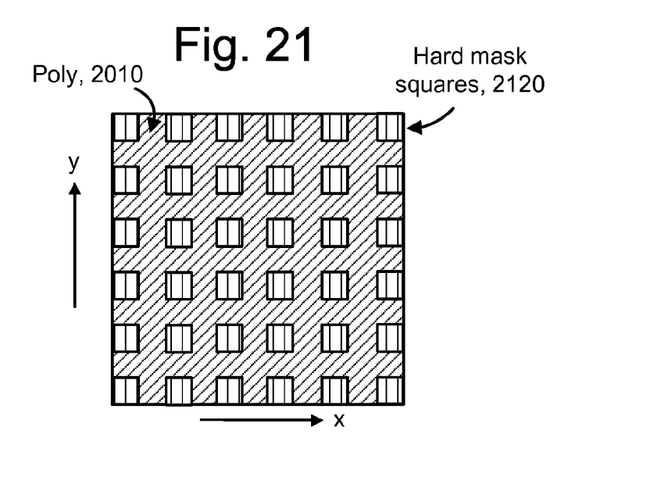
FIG. 21 depicts the substrate of FIG. 20 after stripping the remaining photoresist, revealing remaining portions of the hard mask.

FIG. 21 depicts the substrate of FIG. 20 after stripping the remaining photoresist, revealing remaining portions of the hard mask. Here, the photoresist squares, such as example square 1920 are stripped away to reveal corresponding portions of the hard mask beneath the stripped photoresist, such as example hard mask square 2120. As mentioned, the square shape is provided as an example only, as other shapes may be formed. The hard mask squares extend in a 2-D array across the substrate.

Figure 22:
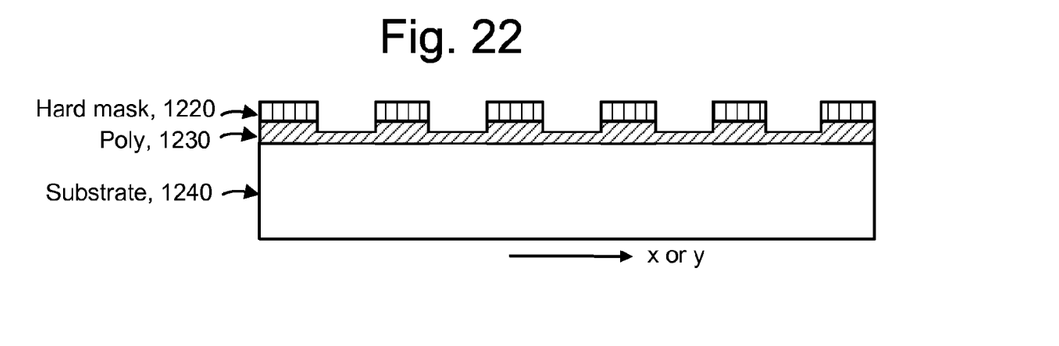
FIG. 22 depicts a cross-sectional view of the substrate of FIG. 21 showing etching of the poly layer using the remaining portions of the hard mask.

FIG. 22 depicts a cross-sectional view of the substrate of FIG. 21 showing etching of the poly layer or other layer using the remaining portions of the hard mask, such as the hard mask squares 2120. Essentially, the pattern formed by the remaining hard mask squares is transferred to the poly layer beneath the hard mask layer, so that a 2-D array of features is formed. The hard mask may or may not removed from the poly or other layer depending on the type of hard mask used and type of etch process used. For example, the features may be raised structures such as shown in FIG. 8. Alternatively, the features may be voids, e.g., holes, such as when a negative photoresist is used.

Figure 23:
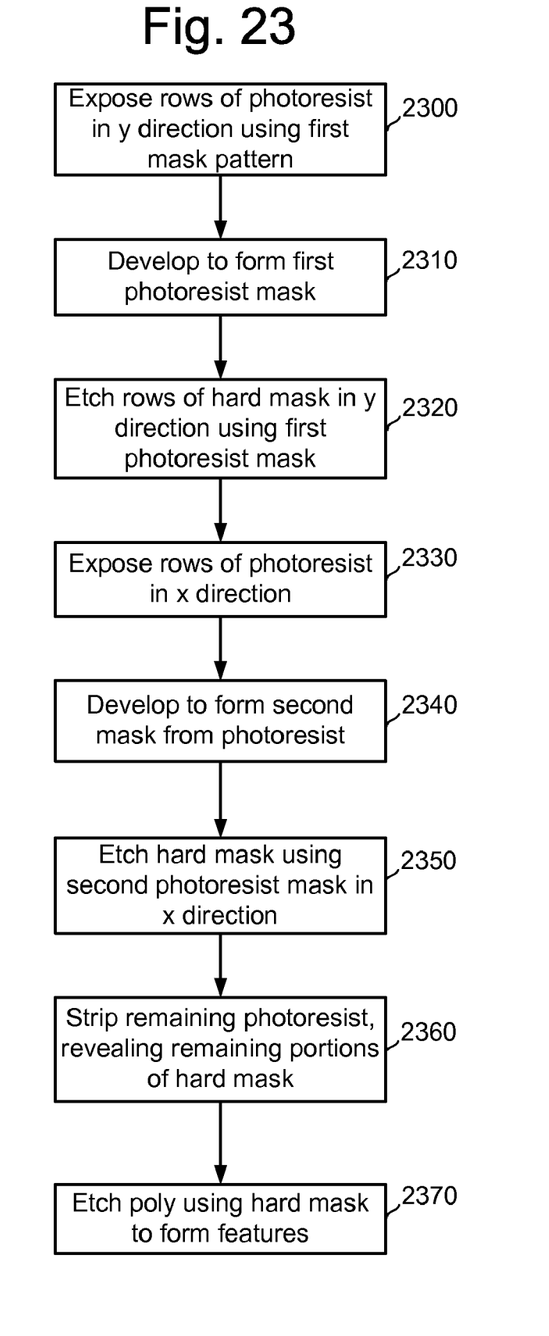
FIG. 23 depicts a photolithographic process based on FIGS. 12-22.

FIG. 23 depicts a photolithographic process based on FIGS. 12-22. Generally, an example process includes transferring a first mask pattern to a photosensitive layer, where the first mask pattern includes spaced apart rows which extend in a first direction, and performing a first etching operation on a hard mask layer beneath the photosensitive layer, after transferring the first mask pattern. A second mask pattern is then transferred to the photosensitive layer, where the second mask pattern includes spaced apart rows which extend in a second direction, such as orthogonal to the first direction. A second etching operation is performed on the hard mask layer after transferring the second mask pattern. A layer, such as a poly layer, which is beneath the remaining portions of the hard mask layer, is then etched to form desired features in the poly layer.

For example, step 2300 includes exposing rows of photoresist in the y direction using a first mask pattern, step 2310 includes developing the photoresist to form a first photoresist mask, which has spaced apart rows corresponding to the first mask pattern (see, e.g., FIGS. 13 and 14). Step 2320 includes etching rows of the hard mask in the y direction using the first photoresist mask, revealing the poly underneath (see, e.g., FIGS. 16b and 17). Step 2330 includes exposing rows of the photoresist in the x direction (see, e.g., FIG. 18). Step 2340 includes developing the photoresist again to form a second mask from the photoresist (see, e.g., FIG. 19). Step 2350 includes etching the hard mask using the second photoresist mask in the x direction (see, e.g., FIG. 20). Step 2360 includes stripping the remaining photoresist, revealing remaining portions of the hard mask (see, e.g., FIG. 21). Step 2370 includes etching the poly beneath the squares of the hard mask to form features such as posts (see, e.g., FIGS. 8 and 22).

Thus, the first and second mask patterns can be transferred to the photosensitive layer via a common mask, e.g., by rotating the mask ninety degrees, or by rotating the photosensitive layer ninety degrees, for instance. Generally, the common mask can be in a first relative position with respect to the photosensitive layer for transferring the first mask pattern, and in a second relative position with respect to the photosensitive layer for transferring the second mask pattern, where the first relative position is rotated relative to the second relative position. Or, the first and second mask patterns can be transferred to the photosensitive layer via different masks. Moreover, additional patterns can be transferred to the photosensitive layer as well.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A photolithographic method for fabricating a pattern on a photosensitive layer on a substrate, comprising:
   first exposing of the photosensitive layer using a mask and optics providing a first exposure pattern; and
   second exposing of the photosensitive layer using the mask and optics providing a second exposure pattern, different than the first exposure pattern, where the optics providing the first exposure pattern and the optics providing the second exposure pattern use immersion lithography to provide a hyper-numerical aperture of approximately 1.0 to 1.5, the photosensitive layer remains in a fixed position relative to the mask during the first and second exposing steps, and the photosensitive layer is not developed or baked between the first and second exposing steps.

2. The photolithographic method of claim 1, wherein:
   the second exposure pattern is orthogonal to the first exposure pattern.

3. The photolithographic method of claim 1, wherein:
   the first and second exposing steps use ultraviolet light having a wavelength of approximately 157 to 193 nm.

4. The photolithographic method of claim 1, wherein:
   the first and second exposure patterns comprise respective orthogonal dipole exposure patterns.

5. The photolithographic method of claim 1, further comprising:
   after the second exposing step, developing the photosensitive layer to form a mask from the photosensitive layer; and
   etching a layer which is beneath the photosensitive layer using the mask formed from the photosensitive layer, thereby forming a two-dimensional array of features in the layer which is beneath the photosensitive layer.

6. The photolithographic method of claim 5, wherein:
   the photosensitive layer comprises a positive photoresist, so that the features comprise posts.

7. The photolithographic method of claim 5, wherein:
   the photosensitive layer comprises a negative photoresist, so that the features comprise voids.

8. The photolithographic method of claim 5, wherein:
   the developing is performed after the first and second exposing steps without performing additional exposing of the photosensitive layer after the first and second exposing steps.

9. The photolithographic method of claim 5, wherein:
   the features are generally rectangular shaped in cross-section, with adjacent sides of different lengths.

10. The photolithographic method of claim 1, wherein:
    the first exposing step results in a light intensity pattern on the photosensitive layer in which lines of intensity minima are substantially equally spaced in a first direction, and the second exposing step results in a light intensity pattern on the photosensitive layer in which lines of intensity minima are substantially equally spaced in a second direction, orthogonal to the first direction.

11. The photolithographic method of claim 10, wherein:
the lines of intensity minima in the first direction are substantially equally spaced at a pitch of approximately 70 nm to 150 nm, and the lines of intensity minima in the second direction are substantially equally spaced in the second direction at a pitch of approximately 70 nm to 150 nm.

12. The photolithographic method of claim 10, wherein:
spacing of the lines of intensity minima in the first direction is substantially equal to spacing of the lines of intensity minima in the second direction.

13. The photolithographic method of claim 1, wherein:
the optics providing the first exposure pattern comprises an x-dipole illuminator having an opaque region and two opposing apertures; and
the optics providing the second exposure pattern comprises a y-dipole illuminator having an opaque region and two opposing apertures.

14. The photolithographic method of claim 1, wherein:
the two opposing apertures in the y-dipole illuminator differ from the two opposing apertures in the x-dipole illuminator, when the y-dipole illuminator is rotated 90 degrees.

15. The photolithographic method of claim 1, wherein:
a size of the two opposing apertures in the y-dipole illuminator differs from a size of the two opposing apertures in the x-dipole illuminator.

16. The photolithographic method of claim 1, wherein:
a length of the two opposing apertures in the y-dipole illuminator differs from a length of the two opposing apertures in the x-dipole illuminator.

17. A photolithographic method for fabricating a pattern on a photosensitive layer on a substrate, comprising:
first exposing of the photosensitive layer using a mask and optics providing a first exposure pattern, resulting in a light intensity pattern on the photosensitive layer in which lines of intensity minima are substantially equally spaced in a first direction at a pitch of approximately 70 nm to 150 nm; and
second exposing of the photosensitive layer using the mask and optics providing a second exposure pattern, different than the first exposure pattern, resulting in a light intensity pattern on the photosensitive layer in which lines of intensity minima are substantially equally spaced in a second direction, orthogonal to the first direction, at a pitch of approximately 70 nm to 150 nm, wherein the optics providing the first exposure pattern and the optics providing the second exposure pattern use immersion lithography to provide a hyper-numerical aperture of approximately 1.0 to 1.5, and the photosensitive layer is not developed or baked between the first and second exposing steps.

18. The photolithographic method of claim 17, wherein:
the second exposure pattern is orthogonal to the first exposure pattern.

19. The photolithographic method of claim 17, wherein:
the first and second exposing steps use ultraviolet light having a wavelength of approximately 157 nm to 193 nm.

20. The photolithographic method of claim 17, further comprising:
developing the photosensitive layer to form a mask from the photosensitive layer; and
etching a layer which is beneath the photosensitive layer using the mask formed from the photosensitive layer, thereby forming a two-dimensional array of features in the layer which is beneath the photosensitive layer.

21. The photolithographic method of claim 20, wherein:
the photosensitive layer comprises a positive photoresist, so that the features comprise posts.

22. The photolithographic method of claim 20, wherein:
the photosensitive layer comprises a negative photoresist, so that the features comprise voids.

23. The photolithographic method of claim 20, wherein:
the developing is performed after the first and second exposing steps without performing additional exposing of the photosensitive layer after the first and second exposing steps.

24. A photolithographic method for fabricating a pattern on a photosensitive layer on a substrate, comprising:
using a mask, first masked exposing of the photosensitive layer using optics providing a first exposure pattern;
first hard baking of the photosensitive layer after the first exposing; and
after the first hard baking, using the mask, second masked exposing of the photosensitive layer using optics providing a second exposure pattern, different than the first exposure pattern, where the optics providing the first and second exposure patterns use immersion lithography to provide hyper-numerical apertures of approximately 1.0 to 1.5, and the photosensitive layer remains in a fixed position relative to the mask during the first and second masked exposing steps.

25. The photolithographic method of claim 24, further comprising:
second hard baking of the photosensitive layer after the second masked exposing step; and
developing the photosensitive layer after the second hard baking.

26. The photolithographic method of claim 25, wherein:
the developing is performed after the first and second masked exposing steps without performing additional exposing of the photosensitive layer after the first and second masked exposing steps.

27. The photolithographic method of claim 25, wherein the developing forms a mask from the photosensitive layer, the method further comprising:
etching a layer which is beneath the photosensitive layer using the mask formed from the photosensitive layer, thereby forming a two-dimensional array of features in the layer which is beneath the photosensitive layer.

28. The photolithographic method of claim 27, wherein:
the photosensitive layer comprises a positive photoresist, so that the features comprise posts.

29. The photolithographic method of claim 27, wherein:
the photosensitive layer comprises a negative photoresist, so that the features comprise voids.

30. The photolithographic method of claim 24, wherein:
the second hard baking uses a time and/or temperature which is approximately 5-15% lower than in the first hard baking.

31. The photolithographic method of claim 24, wherein:
the second exposure pattern is orthogonal to the first exposure pattern.

32. The photolithographic method of claim 24, wherein:
the first and second exposure patterns comprise respective orthogonal dipole exposure patterns.

* * * * *

UNITED STATES PATENT AND TRADEMARK OFFICE
CERTIFICATE OF CORRECTION

PATENT NO. : 7,794,921 B2  Page 1 of 1
APPLICATION NO. : 11/618776
DATED : September 14, 2010
INVENTOR(S) : Chen et al.

It is certified that error appears in the above-identified patent and that said Letters Patent is hereby corrected as shown below:

Title Page, item 73, Assignee: Delete "SanDisk Corporation" and replace with -- SanDisk 3D LLC --

Signed and Sealed this
Eleventh Day of March, 2014

Michelle K. Lee
*Deputy Director of the United States Patent and Trademark Office*